United States Patent
Chen

(10) Patent No.: US 7,172,840 B2
(45) Date of Patent: Feb. 6, 2007

(54) PHOTOMASK FEATURES WITH INTERIOR NONPRINTING WINDOW USING ALTERNATING PHASE SHIFTING

(75) Inventor: Yung-Tin Chen, Santa Clara, CA (US)

(73) Assignee: Sandisk Corporation, Milpitas, CA (US)

( * ) Notice: Subject to any disclaimer, the term of this patent is extended or adjusted under 35 U.S.C. 154(b) by 290 days.

(21) Appl. No.: 10/728,436

(22) Filed: Dec. 5, 2003

(65) Prior Publication Data

US 2005/0123837 A1 Jun. 9, 2005

(51) Int. Cl.
*G01F 9/00* (2006.01)
*G03C 5/00* (2006.01)

(52) U.S. Cl. .......................................... 430/5; 430/311
(58) Field of Classification Search ................ 430/5, 430/311–313; 355/53; 438/286, 301; 716/19–21
See application file for complete search history.

(56) References Cited

U.S. PATENT DOCUMENTS

| | | | |
|---|---|---|---|
| 6,057,063 A | 5/2000 | Liebmann et al. | |
| 6,523,165 B2 | 2/2003 | Liu et al. | |
| 6,541,165 B1 | 4/2003 | Pierrat | |
| 6,551,750 B2 | 4/2003 | Pierrat | |
| 6,569,583 B2 | 5/2003 | Cho et al. | |
| 6,934,007 B2* | 8/2005 | Fritze et al. | 355/53 |
| 2002/0028541 A1* | 3/2002 | Lee et al. | 438/149 |
| 2003/0022074 A1 | 1/2003 | Nolscher | |

OTHER PUBLICATIONS

Bernard, Douglas.A. ,et al. , "Clear Field Dual Alternating Phase Shift Mask Lithography", *Optical Microlithography XV, SPIE* vol. 4691, (2002),999-1008.

Burkhardt, M.,et al. , "Through Pitch Correction of Scattering Effects in 193 nm Alternating Phase Shift Masks", *Optical Microlithography XV* vol. 4691, No. I, SPIE, (2002),348-358.

Cha, Han-Sun.,et al. , "A Study on Optimization of Alternating Phase Shifting Mask Structure", *21st Annual BACUS Symposium on Photomask Technology, SPIE* vol. 4562, No. II, (2002),1008-1016.

Ferguson, Richard.A. , "Pattern-Dependent Correction of Mask Topography Effects for Alternating Phase-Shifting Masks", *SPIE* vol. 2440, (2/95),349-360.

Griesinger, Uwe.,et al. , "Balancing of Alternating Phase Shifting Masks for Practical Application: Modeling and Experimental Verification", *Proc. of SPIE*, vol. 4186, (2001),372-383.

Griesinger, Uwe.,et al. , "Transmission & Phase Balancing of alternating Phase Shifting Masks (5X)- Theoretical & Experimental Result", *19th Annual Symposium on Photomask Technology* vol. 3873, No. 1, SPIE, Published in: Monterey, US,(1999),359-369.

Irie, Shigeo., "Sub-70-nm Pattern Fabrication using an Alternating Phase Shifting Mask in 157-nm Lithography", *Optical Microlithography XV, SPIE*, vol. 4691, (2002),1654-1664.

Kang, Myung-Ah., "Feasibility evaluations of alternating phase shift mask for imaging sub-80nm feature with KrF", *Optical Microlithography XVI, SPIE* vol. 5040, (2003),1115-1124.

(Continued)

*Primary Examiner*—S. Rosasco
(74) *Attorney, Agent, or Firm*—Vierra Magen Marcus & DeNiro LLP

(57) ABSTRACT

Aspects of the present invention provide for a novel photomask for patterning features for an integrated circuit, the photomask including masked features having interior nonprinting windows. In some embodiments, the interior nonprinting window is an alternating phase shifter, while the area surrounding the masked features transmits light unshifted. In other embodiments, the interior nonprinting window transmits light unshifted, while the area surrounding the masked features is an alternating phase shifter. Thus any arrangement of features can be patterned with no phase conflict.

7 Claims, 8 Drawing Sheets

OTHER PUBLICATIONS

Kim, Keeho.,et al. , "Optimization of Process Condition to Balance MEF and OPC for Alternating PSM-Control of Forbidden Pitches", *Optical Microlithography XV*, vol. 4691, No. I, *SPIE*, (2002),240-246.

Koo, Sang-Sool.,et al. , "Study on the Potentialities of sub-100nm Optical Lithography of Alternating and Phase-edge Phase Shift Mask for ArF Lithography", *20th Annual BACUS Symposium on Photomask Technology*, vol. 4186, *SPIE*, (2001),346-358.

Kostelak, R.L. ,et al. , "Exposure Characteristics of Alternate Aperture Phase-Shifting Masks Fabricated using a Subtractive Process", *J. Vac. Sci. Tech. B*, vol. 10(6), (Nov./Dec. 1992),3055-3061.

Levensen, M.D. ,et al. , "Phase Phirst! An Improved Strong-PSM Paradigm", *Proc. os SPIE*, vol. 4186, (2001),395-404.

Lin, Chih-Cheng.,et al. , "Alternating PSM defect printability at 193-nm wavelength", *21st Annual BACUS Symposium on Photomask Technology* vol. 4562, No. II, *SPIE*, (2002),1121-1125.

Maurer, Wilhelm.,et al. , "Proximity Effects of Alternating Phase Shift Masks", *19th Annual Symposium on Photomask Technology*, vol. 3873, No. I, *SPIE*, Sep. 1999,344-349.

Misaka, Akio.,et al. , "Improved outline phase shifting mask for reduction of the mask error enhancement factor", *Optical Microlithography XVI, Proceedings of SPIE*, vol. 5040, (2003),1220-1230.

Murai, Shiaki.,et al. , "Establishment of Production Process and Assurance Method for Alternating Phase Shift Masks", *20th Annual BACUS Symposium on Photomask Technology,SPIE* vol. 4186, (2001),890-901.

Petersen, John.S. ,et al. , "Designing Dual-Trench Alternating Phase-Shift Masks for 140 NM and Smaller Features Using 248 NM KRF and 193 NM ARF Lithography", *Proc. of SPIE*, vol. 3412, (1998),503-520.

Pierrat, C., "Investigation of Proximity Effects in Alternating Aperture Phase Shifting Masks", *20th Annual BACUS Symposium on Photomask Technology*, vol. 4186, *SPIE*, (2001),325-335.

Pierrat, Christophe.,et al. , "New alternating phase-shifting mask conversion methodology using phase conflict resolution", *Optical Microlithography XV*, vol. 4691, No. I, *SPIE*, (2002),325-335.

Saitou, Hidetaka.,et al. , "Improvement of Alt-PSM Production Process Using Backside Phase Measurement Method", *21st Annual BACUS Symposium on Photomask Technology* vol. 4562, No. II, *SPIE*,(2002),1087-1095.

Shin, In-Gyun.,et al. , "A Study on the effect of mask reduction ratio in alternating phase shift masks", *20th Annual BACUS Symposium on Photomask Technology*, vol. 4186, *SPIE*, (2001),309-315.

Spence, Christopher.,et al. , "Integration of Optical Proximity Correction Strategies in Strong Phase Shifters Design for Poly-Gate Layers", *19th Annual Symposium on Photomask Technology*, vol. 3873, No. I *SPIE*, (Sep. 1999),277-287.

Tan, Sia.K. , "Optimization of Alternating PSM Mask Process for 65 nm Poly Gate Patterning Using 193 nm Lithography", *Optical Microlithography XVI, SPIE* vol. 5040 (2003),1125-1136.

Thiele, Jorg.,et al. , "Introduction of full level alternating phase shift mask technology into IC manufacturing", *Optical Microlithography XV*, vol. 4691, No. I, *SPIE*, (2002),89-97.

Tsai, W.,et al. , "Technological Challenges in Implementation of Alternating Phase Shift Mask", *20th Annual BACUS Symposium on Photomask Technology*, vol. 4186, *SPIE*, (2001),433-443.

Westerman, R.,et al. , "Plasma Etching of Quartz for the Fabrication of Alternating Aperture Phase Shift Photomasks: Etch Rate Uniformity Study", *20th Annual BACUS Symposium on Photomask Technology*, vol. 4186, *SPIE*, (2001),316-324.

Wu, Clive., "Alternating PSM Design and Its Implications to the Design-to-Manufacturing Flow", ?, Numerical Technologies, Inc. 70 W. Plumeria Dr., San Jose, CA 95134,7 pgs.

Yamamoto, Tomohiki.,et al. , "Impact of Alternating Phase Shift Mask Quality on 100 nm Gate Lithography", *20th Annual BACUS Symposium on Photomask Technology*, vol. 4186, *SPIE*, (2001),423-432.

Yoon, Si-Yeul.,et al. , "Evaluation of various alternating phase shifting mask processes for KrF lithography", *21st Annual BACUS Symposium on Photomask Technology* vol. 4562, No. II, *SPIE*, (2002),1017-1025.

\* cited by examiner

PHOTOMASK FEATURES WITH INTERIOR NONPRINTING WINDOW USING ALTERNATING PHASE SHIFTING

BACKGROUND OF THE INVENTION

The invention relates to a method for patterning fine features for semiconductor devices using an alternating phase shifting mask.

Patterned features making up integrated circuits are conventionally formed using photolithography and etch techniques. A photomask, which transmits light in some areas and blocks it in others, is formed, the blocking areas corresponding to the pattern to be formed on the wafer surface (or its inverse.) The surface to be patterned, for example a semiconductor or dielectric layer, is covered with a layer of photoresist, a photoreactive material. Light is projected onto the photoresist surface using the photomask, selectively exposing areas of photoresist. The wafer is then subjected to a developing process, in which exposed photoresist (or unexposed photoresist, in the case of negative photoresist) is removed, leaving patterned photoresist behind.

The remaining patterned photoresist then typically serves to protect underlying material during a subsequent etch process, creating features in the same pattern as the remaining photoresist.

Over the years integrated circuits have become denser and patterned features smaller. As projected features become smaller, the limits of resolution are reached and it becomes more difficult to project patterns with sharp edges. Poor resolution can lead to incomplete patterning and to incomplete etching or overetching, causing device flaws.

Alternating phase shifters, which invert the phase of light in some areas of the photomask, increasing contrast in light intensity at the photoresist surface, are a powerful tool to improve resolution and sharpen edges.

The use of alternating phase shifters in photomasks, however, has disadvantages. When alternating phase shifters are used, projected light is either incident, in what will be called zero degree phase, or inverted, in what will be called 180 degree phase (this is sometimes also called π phase.) As will be more fully described, as conventionally used, light in opposite phases must be transmitted on opposite sides of an obscured area. The configuration of some patterns leads to phase conflicts, in which rules dictate that the same area must see light of opposite phases. To date, this has meant that use of alternating phase shifters has been limited to only certain types of patterns.

Alternating phase shifters also typically require use of a trim mask, adding extra cost and processing time.

There is a need, therefore, to improve flexibility in the use of alternating phase shifters in photomasks.

SUMMARY OF THE INVENTION

The present invention is defined by the following claims, and nothing in this section should be taken as a limitation on those claims. In general, the invention is directed to an improved method for using alternating phase shifters in a photomask for photolithography.

A first aspect of the invention provides for a photomask for patterning fine features comprising a first masked feature; a first transmitting nonprinting window substantially entirely enclosed within a perimeter of the first masked feature; and a first transmitting area substantially entirely surrounding the perimeter of the first masked feature in the plane of the photomask, wherein light transmitted through the first window, after transmission through the first window, is in a first phase, and light transmitted through the first transmitting area, after transmission through the first transmitting area, is in a second phase substantially opposite the first phase.

A related aspect of the invention provides for a photomask for patterning fine features comprising a first nonprinting alternating phase shifter wherein light transmitted through the photomask reaching a photoresist surface substantially entirely within a perimeter of a projected photoresist feature is in a first phase, and light reaching a photoresist surface outside and in proximity to the perimeter of the projected photoresist feature, on all sides of the projected photoresist feature, is in a second phase substantially opposite the first phase.

Another aspect of the invention provides for a patterned feature on a semiconductor device, said patterned feature patterned from a masked feature in a photomask, said photomask comprising a transmitting nonprinting window, the window substantially entirely enclosed within a perimeter of the masked feature; and a transmitting area, the transmitting area substantially entirely surrounding the perimeter of the masked feature in the plane of the photomask, wherein either the window or the transmitting area comprises an alternating phase shifter.

A preferred embodiment of the invention provides for a plurality of patterned features on a semiconductor device, said features patterned from masked features in a photomask, each of said masked features comprising a nonprinting window substantially entirely enclosed within a perimeter of the masked feature, and each of said masked features substantially entirely surrounded in the plane of the photomask by a common transmitting area, wherein either the window or the transmitting area comprises an alternating phase shifter.

A related embodiment of the invention provides for a photomask for patterning fine features comprising a first nonprinting transmitting window substantially entirely enclosed within a perimeter of a first masked feature; and a transmitting area substantially entirely surrounding and in proximity to the perimeter of the first masked feature in the plane of the photomask, wherein the transmitting area operates as a first alternating phase shifter.

Yet another aspect of the invention provides for a method of forming a plurality of substantially evenly spaced pillars, the method comprising forming a layer of a first material; depositing photoresist on the first material; patterning the photoresist using light having a wavelength of about 248 nm or more; etching the first material to form the plurality of substantially evenly spaced pillars, the pillars having a pitch between about 220 and about 280 nm.

Each of the aspects and embodiments of the invention can be used alone or in combination with one another.

The preferred aspects and embodiments will now be described with reference to the attached drawings.

BRIEF DESCRIPTION OF THE DRAWINGS

FIG. 1b shows the electrical field in the plane of the photomask for the photomask of FIG. 1a.

FIG. 1c shows the light intensity at the surface of the photoresist for light projected through the photomask of FIG. 1a.

FIG. 2b shows the electrical field in the plane of the photomask for the photomask of FIG. 1a.

FIG. 2c shows the light intensity at the surface of the photoresist for light projected through the photomask of FIG. 1a.

DETAILED DESCRIPTION OF THE INVENTION

As described earlier, as part of the process of forming patterned features on an integrated circuit, light is projected through a photomask onto a photoresist surface. A feature in a mask is projected onto photoresist, then the photoresist feature is used to etch a feature in an underlying material, or in multiple layers of materials.

In this description, a masked feature will refer to a feature in a photomask. Such a feature may be a line, a rectangle, or any other shape. A masked feature in a photomask substantially entirely or partially obscures light, so that when light is projected through the photomask, a corresponding feature in the photoresist is shielded from light, while the area outside of the obscured area is exposed. This corresponding feature in photoresist will be called a projected photoresist feature. The projected photoresist feature will be roughly the same shape as the masked feature, though corners on projected photoresist features tend to be rounded. Typically a linear dimension in a masked feature is four or five times the size of the corresponding dimension in the projected photoresist feature, depending on the stepper used.

Next the photoresist is developed, removing exposed photoresist and leaving only the projected photoresist features. (Note that negative photoresist is also known in the art. When developed, the exposed areas of negative photoresist remain, while the obscured areas are removed. For clarity, this description will omit discussion of negative photoresist. The skilled practitioner will appreciate that the techniques of the present invention can be used with negative photoresist as well, however.) The projected photoresist features are then used to protect underlying layers in a subsequent processing step, such as a etch step.

The underlying feature created in the pattern of the projected photoresist feature will be called a patterned feature. A patterned feature is roughly the same size and shape as the projected photoresist feature used to create it, though many variables in the etch process may cause it to be larger, smaller, more rounded, etc. It will be understood by those skilled in the art that the many varieties of etches make up the conventional method to create a patterned feature from a projected photoresist feature, but that other methods can be imagined.

Figure 1A:
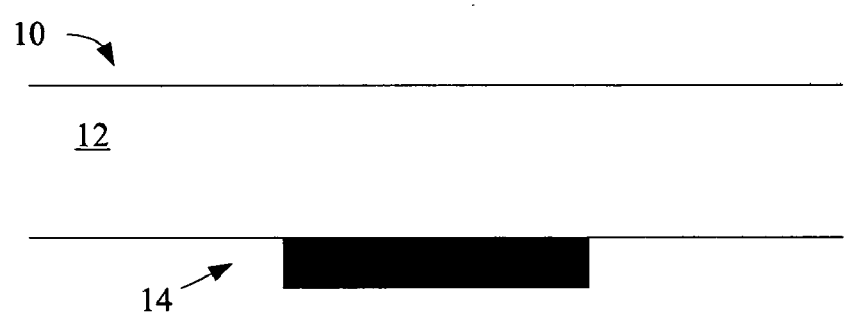
FIG. 1a is a cross section of a portion of a conventional binary photomask.
Figure 1B:
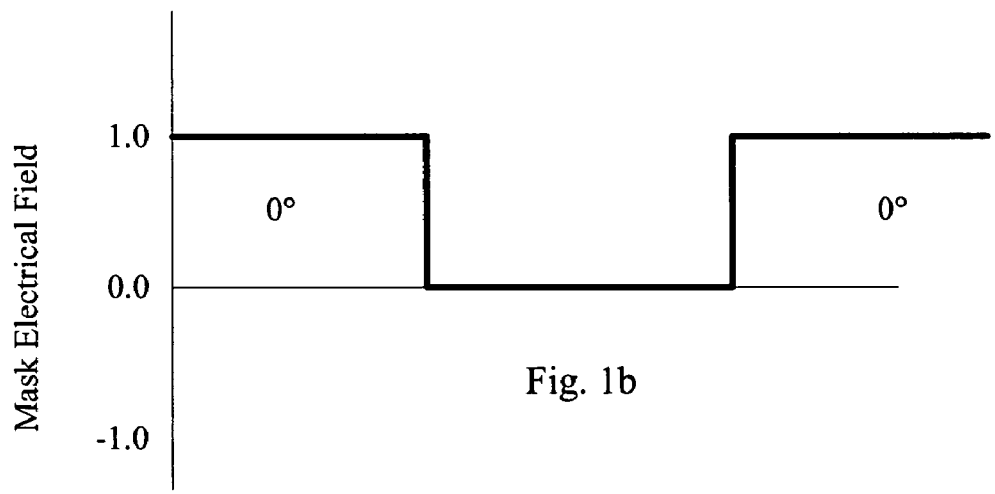

The simplest photomask is a binary photomask 10, shown in FIG. 1a. A plate of a transmitting material 12, for example quartz, makes up the bulk of the photomask. A blocking material 14, typically chromium, is formed in areas where light is to be obscured. FIG. 1b shows the electrical field in the plane of the photomask. The electrical field is either positive (1.0), non-existent (0), or negative (−1.0). Where light is transmitted it is in a first phase, here referred to as zero degree phase. Where light is blocked, there is no electrical field. (In FIGS. 1b and 1c, the x-axis is horizontal position, corresponding with horizontal position across the section of photomask shown in FIG. 1a.)

Figure 1C:
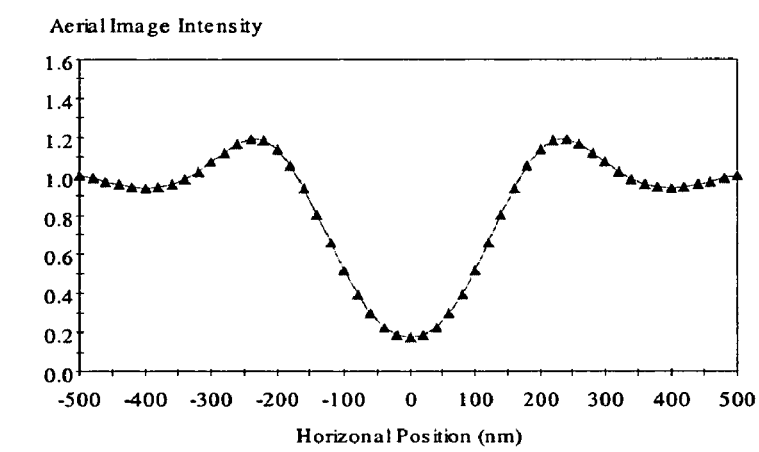

FIG. 1c shows the actual intensity distribution of light at the photoresist surface. It will be seen that, due to interference effects, the edges of lighter and darker areas are not perfectly defined, and even in the center of the obscured area, the intensity at the photoresist surface is not zero. (A value of zero on the y-axis of FIG. 1c indicates zero intensity. The value of 1.0 is unitless and arbitrarily assigned, and the other values assigned relative to it. This is a standard representation of image intensity, as will be known to those skilled in the art.)

Figure 2A:
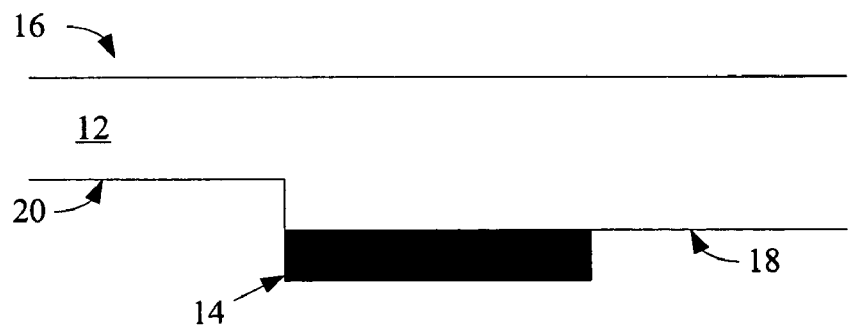
FIG. 2a is a cross section of a portion of an alternating phase shifting photomask.

FIG. 2a illustrates an alternating phase shifting photomask 16. This photomask is also made up of a plate of transmitting material 12, with regions of blocking material 14. In region 18, light is transmitted as in the binary mask. In region 20, however, the transmitting area 12 is etched such that light passing through it is shifted 180 degrees. An area of a photomask which inverts the phase of incident light, such as transmitting area 12, will be called an alternating phase shifter.

Figure 2B:
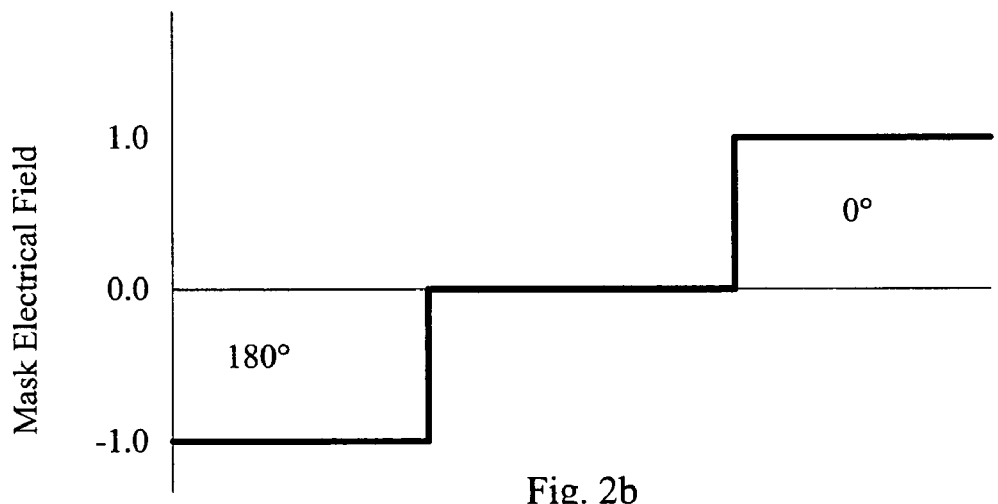

FIG. 2b shows the electrical field in the plane of the photomask: Where light is transmitted with no phase shifting, it is in the first phase, zero degree phase. Where light is blocked, there is no electrical field. Where light is transmitted with phase shifting, it is in 180 degree phase, opposite the first phase. It will be understood that while light in 180 degree phase is perfectly opposite light in zero degree phase, some small deviation can be tolerated; for example light can be in 179 or 183 degree phase rather than 180 degree phase and have substantially the same effect. For purposes of this description, within ten degrees of 180 degrees will be considered to be substantially opposite zero degrees. (In FIGS. 2b and 2c, the x-axis is horizontal position, corresponding with horizontal position across the section of photomask shown in FIG. 2a.)

Figure 2C:
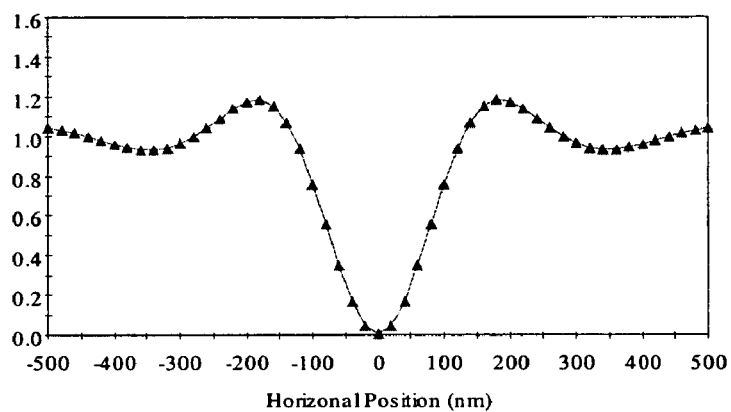

FIG. 2c shows the intensity distribution of light at the photoresist surface. While the electrical field shown in FIGS. 1b and 2b can be either positive or negative, light intensity at the photoresist surface is only zero or positive, since the exposure intensity is proportional to the square of the electric field. The transition from a positive to a negative electrical field in the photomask creates a forced zero of light intensity reaching the photoresist surface, effectively causing dark areas to appear "darker", and making edges sharper.

Figure 3:
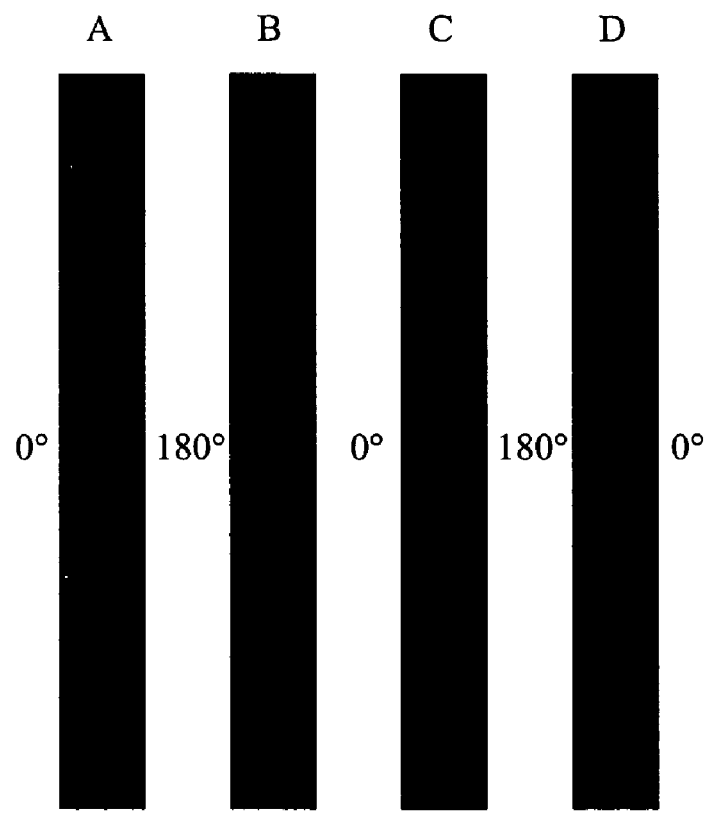
FIG. 3 illustrates phase assignment for a line-and-space pattern using an alternating phase shifting mask.

It will be seen that for an alternating phase shifting mask (this term will be used to describe a photomask employing alternating phase shifters), opposite phases should be used on opposite sides of an obscured region. Phase assignment—the process of determining which phase is to be used in which transmitting area of the photomask—is straightforward for some patterns, such as the alternating line-and-space pattern pictured in FIG. 3. Zero degree phase is assigned to the left of line A, 180 degrees between lines A and B, zero degrees between lines B and C, etc.

Figure 4:
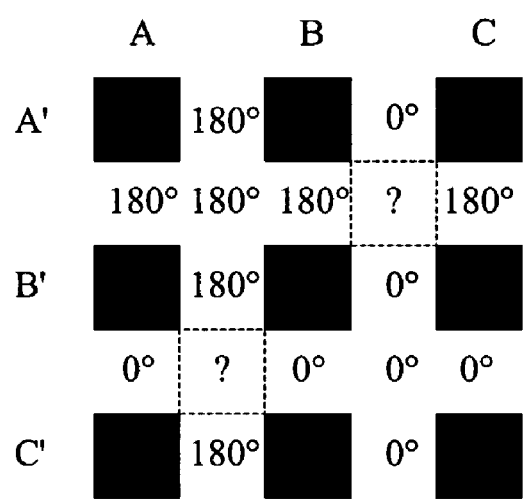
FIG. 4 illustrates phase conflict for rectangular shapes arranged in a grid using an alternating phase shifting mask.

Other patterns present difficulties, however. FIG. 4 shows a mask including rectangular masked features arranged in a grid pattern. Suppose all areas between rectangles in row A' and in row B' are assigned to 180 degree phase, and all areas between rectangles in row B' and in row C' are assigned to 0 degree phase. Suppose further that all areas between rectangles in column A and in column B are assigned to 180 degree phase, and all areas between rectangles in column B and in column C are assigned to 0 degree phase.

Figure 5:
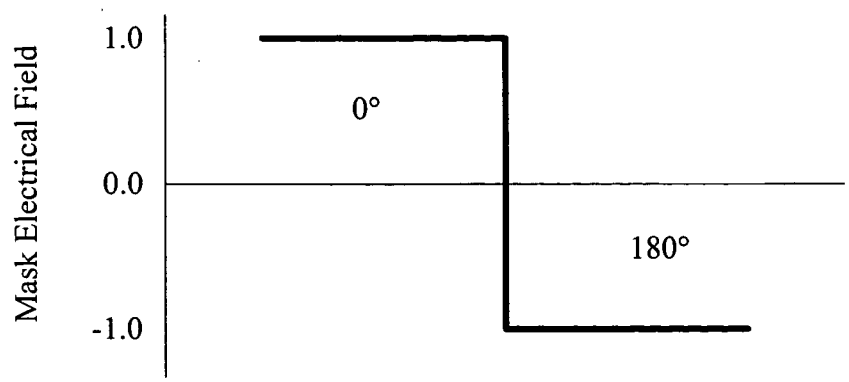
FIG. 5 shows the electrical field in the plane of the photomask when an unshifted region is immediately adjacent a shifted region.

It will be seen that in framed areas marked with a question mark ("?") either phase could be appropriate, depending on whether the row rule or the column rule is followed. If either phase is assigned, a region of zero degree phase will be immediately adjacent a region of 180 degree phase. In the transition from zero degree phase to 180 degree phase, the electrical field must pass through zero, as shown in FIG. 5. (The x-axis on this figure again corresponds to horizontal position across the photomask.) Where the electrical field is zero, the light intensity at the photoresist surface will be zero, unintentionally creating a region of unexposed photoresist, leading to a residual photoresist feature after developing.

The present invention provides a solution to phase conflicts for essentially any photomask pattern. If a transmitting region in a photomask is small enough, it will transmit light but will not "print", i.e. it will not expose photoresist at the photoresist surface. In the present invention, masked features such as those shown in FIG. 4 include an interior nonprinting window. Light transmitted through the nonprinting window is in a first phase, while light transmitted through a transmitting area outside the masked feature is in a second phase opposite the first phase. For example, the window may be an alternating phase shifter, such that light transmitted through the window is in 180 degree phase, while light outside the masked feature is in 0 degree phase. Alternatively, the window may transmit light in zero degree phase, while the transmitting area outside the masked feature is in 180 degree phase. The window is described as "nonprinting" because its dimensions are selected so that it will not print, i.e. such that light transmitted through it will not substantially expose photoresist within the perimeter of the corresponding projected photoresist feature.

When this description describes a window as "interior" it means that the window is substantially entirely enclosed within the perimeter of a masked feature. The transmitting area outside a masked feature substantially entirely surrounds the perimeter of the masked feature on all sides of the masked feature in the plane of the photomask.

Figure 6A:
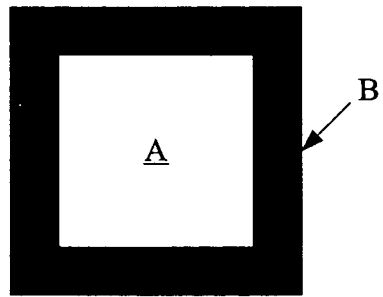
FIG. 6a and 6b illustrate imperfections in surrounding blocking material.
Figure 6B:
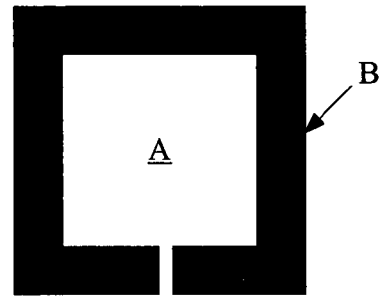

When this description speaks of a material as "substantially entirely" surrounded by another material, it will be understood that small breaks or imperfections in the surrounding material may exist, either accidentally or intentionally, while the result is the same as though the break or imperfection did not exist. FIG. 6a, for example, illustrates a nonprinting window A substantially entirely surrounded by blocking material B. In this case blocking material B has no breaks in it. FIG. 6b shows a similar nonprinting window B substantially entirely surrounded by blocking material B. In 6b, however, a small imperfection exists in blocking material B. If the width of the imperfection is very small, for example 30 angstroms or less, the result when the photomask is used will be the same as if the imperfection did not exist. The embodiments shown in FIG. 6a and 6b are considered to be equivalent, and both to fall within the scope of the invention.

Figure 7A:
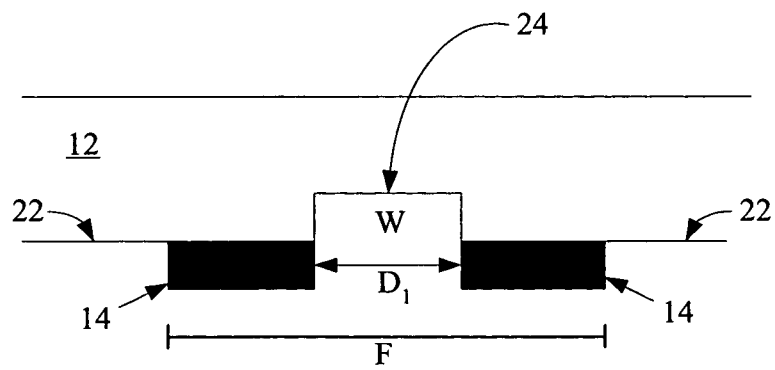
FIG. 7a is a cross-section of a photomask having a nonprinting interior window comprising an alternating phase shifter within a masked feature.

Turning to FIG. 7a, the surrounding regions of blocking material 14 and nonprinting window W make up a single masked feature F. Distance $D_1$ is selected such that window W is nonprinting. In transmitting area 22 outside and in proximity to masked feature F, light is in zero degree phase. In region 24, light is shifted to 180 degree phase. Region 24 is an alternating phase shifter.

Figure 7B:
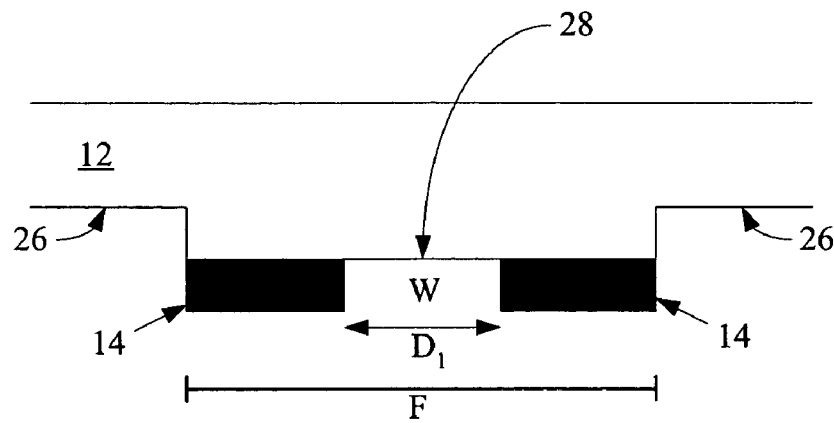
FIG. 7b is a cross-section of a photomask having a nonprinting interior window wherein an alternating phase shifter substantially entirely surrounds a masked feature.

FIG. 7b shows the opposite case. The surrounding regions of blocking material 14 and nonprinting window W again make up a single masked feature F, and distance $D_1$ is selected such that window W is nonprinting. In transmitting area 26 outside and in proximity to masked feature F, light is shifted to 180 degree phase. In region 28, light is in zero degree phase. Region 26 is an alternating phase shifter.

Figure 8A:
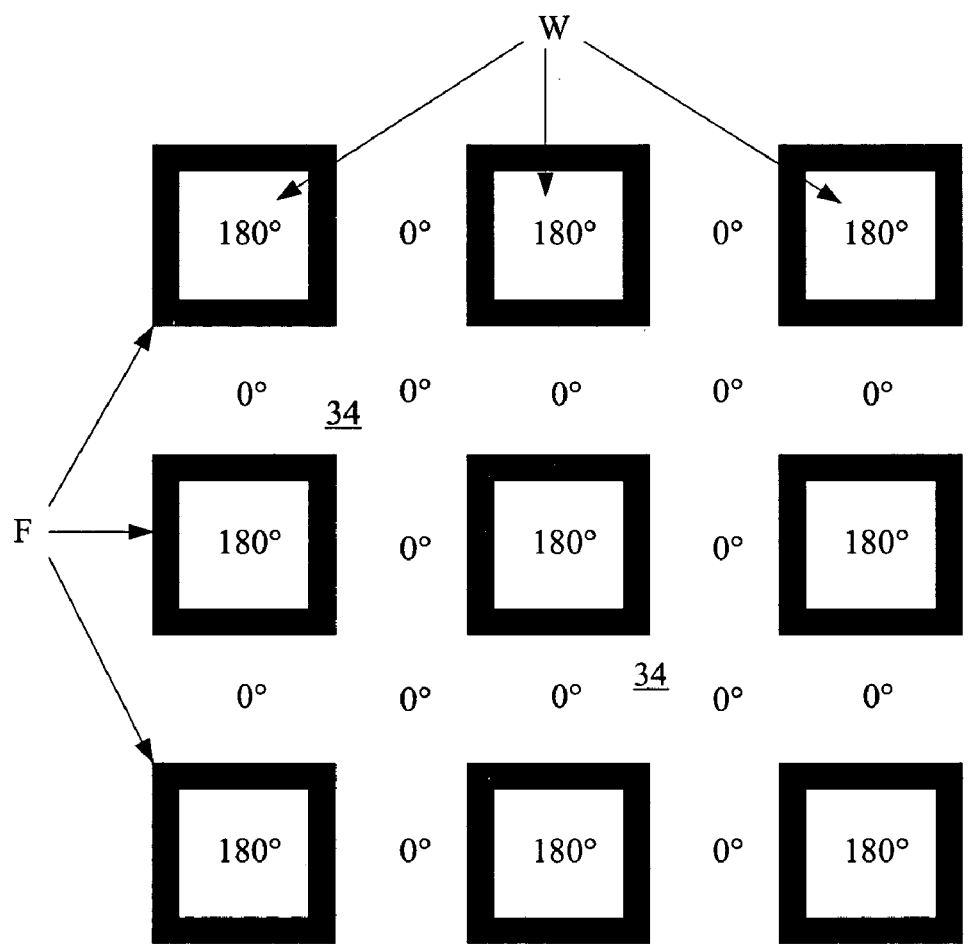
FIG. 8a shows successful phase assignment for rectangular shapes arranged in a grid pattern using nonprinting interior alternating phase shifters.

Turning to FIG. 8a, it will be seen that masked features with interior nonprinting windows, having light in one phase inside the masked feature and light in an opposite phase outside the masked feature, can be printed with no phase conflict. Each masked feature F of FIG. 8a includes a window W, the window W comprising an alternating phase shifter. Thus the windows W are assigned 180 degree phase. The transmitting area 34 commonly and substantially entirely surrounding the masked features F is assigned zero degree phase. The masked features F in FIG. 8a are constructed according to the cross-section of FIG. 7a.

Figure 8B:
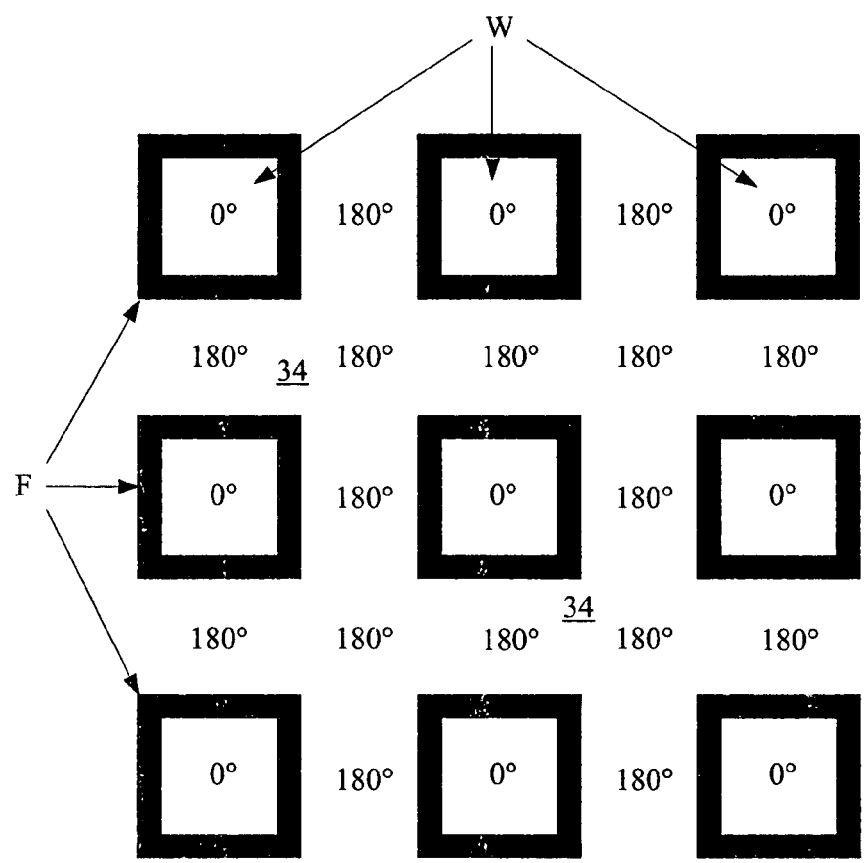
FIG. 8b shows the pattern of FIG. 8a with inverse phase assignment.

Alternatively, as in FIG. 8b, each masked figure F of FIG. 8b includes a window W. The window W transmits light in zero degree phase, while transmitting area 34 commonly and substantially entirely surrounding the masked features F is assigned 180 degree phase, and is an alternating phase shifter. The masked features F in FIG. 8b are constructed according to the cross-section of FIG. 7b.

In short, the present invention allows patterning using an alternating phase shifting mask for patterns other than line-and-space patterns, such as patterns in which features are substantially evenly spaced islands, such as the squares of FIGS. 8a and 8b. Random shapes in a random arrangement can be patterned as well.

Accordingly, when using a photomask according to the present invention, light transmitted through the photomask reaching a photoresist surface substantially entirely within a perimeter of a projected photoresist feature is in a first phase, and light reaching a photoresist surface outside and in proximity to the perimeter of the projected photoresist feature, on all sides of the projected photoresist feature, is in the opposite phase. The same can apply to a plurality of features with no phase conflict. The phase shifted area can be either within or outside the masked features.

Monolithic three dimensional memory arrays such as the one taught in Herner et al., U.S. patent application Ser. No. 10/326470, "An Improved Method for Making High Density Nonvolatile Memory," filed Dec. 19, 2002, hereby incorporated by reference, include a plurality of substantially evenly spaced pillars. These pillars can comprise polycrystalline silicon, called polysilicon. The pillars are portions of memory cells, and the memory cells formed in the same patterning steps generally form a portion of a memory level at a first height above a substrate. Such a monolithic three dimensional memory array further comprises at least a second memory level formed at a second height above the substrate, the second height different from the first height.

Figure 9:
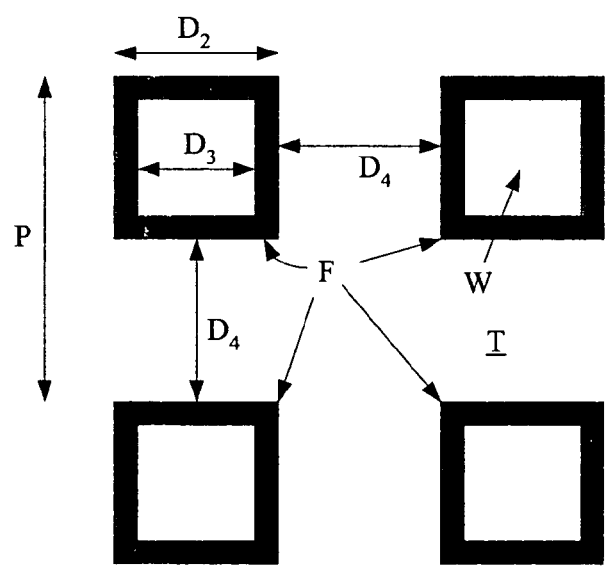
FIG. 9 illustrates sizes of the nonprinting interior window, a masked feature, space between features, and pitch among masked features in a photomask according to the present invention.

A photomask according to the present invention can advantageously be used to form pillars such as those described in Herner et al. FIG. 9 shows an advantageous layout of masked features F comprising nonprinting windows W, wherein light transmitted through the windows W is in a first phase and light transmitted through the transmitting area T outside the masked features F is in a second phase opposite the first phase. The features F are preferably squares with edge $D_2$, and the windows are centered squares with edge $D_3$, while the space between masked features F is $D_4$. Pitch is the distance, in a repeating pattern, between occurrences of the same edge, center, etc.; for example between centers of adjacent lines, or between the starting edge of one line and the starting edge of the next. In FIG. 9, then, pitch is P. The substantially evenly spaced pillars of Herner et al., which are formed using a photomask like the one shown in FIG. 9 or in FIG. 8*a* or 8*b*, have a pitch of between about 220 nm and 280 nm, preferably about 260 nm, and are patterned using light having a wavelength of 248 nm. An alternating phase shift mask paired with a quadrupole aperture is highly effective for patterning regularly spaced pillars.

It will be recalled that light is projected through a photomask having a masked feature to create a corresponding projected photoresist feature. The projected photoresist feature is then processed, typically by etching, to create a patterned feature. Pillars, for example the pillars of Herner et al., are the patterned features created from the masked features F of FIG. 9. As noted earlier, while a patterned feature will be roughly the same size as the projected photoresist feature from which it was created, there is a scaling factor, typically about four or five times, between the linear size of a projected photoresist feature and the masked feature from which it was created; the masked feature is larger.

When describing dimensions in a photomask, it is usual to speak of those dimensions in terms of the projected dimensions; i.e. rather than describing the size of a masked feature, one describes the size of the projected photoresist feature it will create. This description will follow this convention. For clarity, a masked dimension will be described as "×S", or multiplied by a projection scaling factor S. For example, a dimension of 200 nm in a projected photoresist feature will be described as a dimension of 200 nm×S in a masked feature. If, for example, the projection scaling factor S is four, the actual dimension in the masked feature of 200 nm×S will be 800 nm. If the projection scaling factor S is five, 200 nm×S will be 1000 nm.

Referring again to FIG. 9, to produce projected photoresist features having a width of about 130 nm, dimension $D_2$ is about 130 nm×S. Dimension $D_3$ is between about 30 nm×S and about 90 nm×S, preferably about 50 nm×S. Dimension $D_4$ is about 130 nm×S. The projected photoresist features are then etched to form the patterned features, which will be pillars, as described in Herner et al. As noted in Herner et al., while the masked feature is rectangular, the cross-section of the patterned feature will tend to be substantially cylindrical. The dimensions given here assume that the light has a wavelength of 248 nm.

Figure 10:
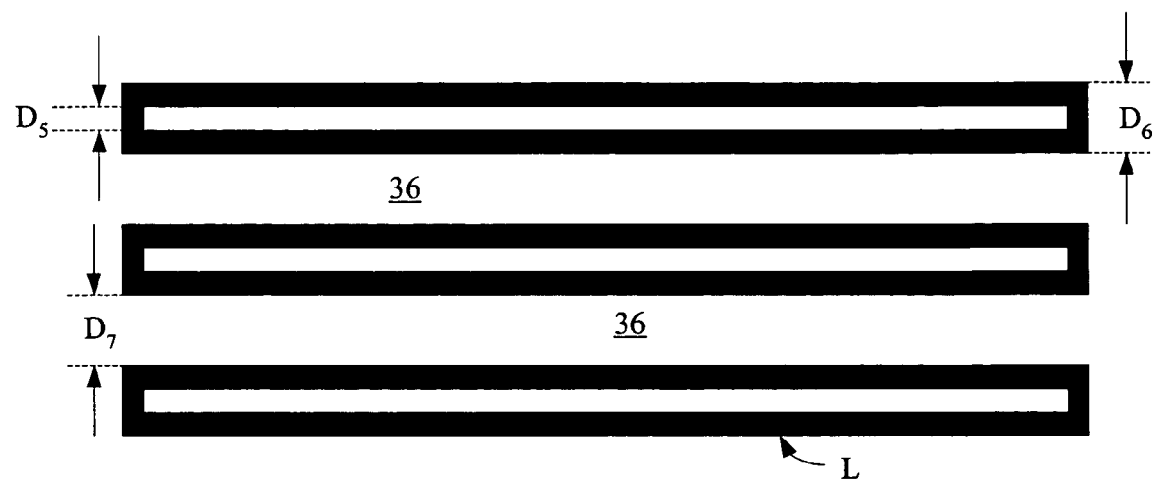
FIG. 10 is a plan view of a photomask having masked features with nonprinting interior windows according to the present invention for patterning a line-and-space pattern.

Masked features according to the present invention can also be used to form patterned lines, such as the conductors of Herner et al., which may comprise tungsten. The masked features with interior windows could be formed as shown in FIG. 10. Dimension $D_5$, the width of the interior nonprinting window, is preferably between about 30 nm×S and about 70 nm×S. Dimension $D_6$, the width of each line, is preferably between about 100 and 130 nm×S. Dimension $D_7$, the width of the gap between lines, is preferably between about 100 and 130 nm×S. As described earlier, the nonprinting window inside each masked feature line L is an alternating phase shifter. Alternatively, the nonprinting window can transmit light without inverting its phase, while the transmitting area 36 commonly and substantially entirely surrounding the masked feature lines L is an alternating phase shifter.

An advantage of the present invention is that masked features of any shape, in any arrangement, can be formed in a photomask using alternating phase shifters with no phase conflict.

Figure 11A:
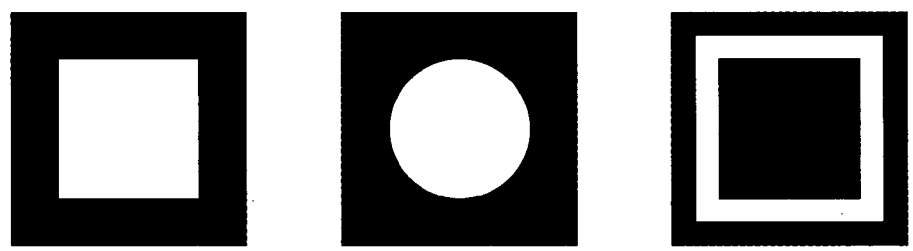
FIG. 11a illustrates possible shapes of nonprinting interior windows.
Figure 11B:
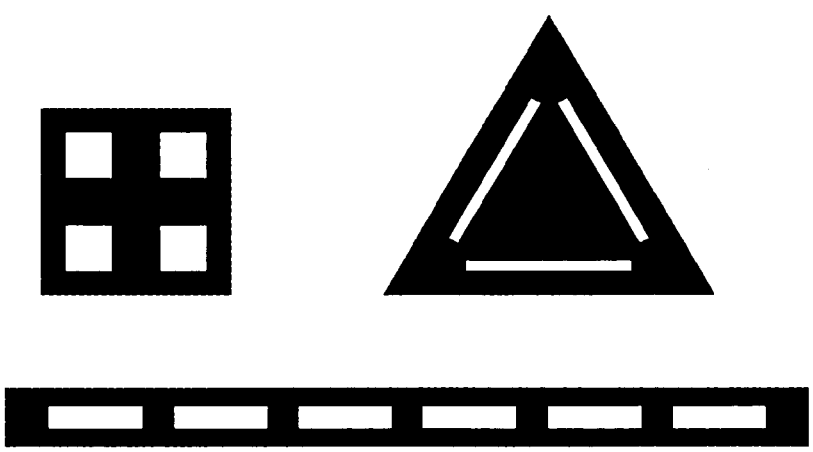
FIG. 11b illustrates possible arrangements having more than one nonprinting interior window inside a single masked feature.

A nonprinting interior window of the present invention, which is substantially entirely enclosed within the perimeter of a masked feature, can be any shape. Advantageous shapes may be polygonal, round, or frame, as shown in FIG. 11*a*. Multiple windows can be used within a single masked feature, as shown in FIG. 11*b*.

If a nonprinting window within a masked feature in a photomask according to the present invention is too large, it will print, exposing photoresist. If it becomes too small, it will no longer be effective (for light with wavelength of 248 nm, this limit is believed to be reached when the window's dimensions reach about 30 nm×S or less); in addition, a very small window becomes increasingly difficult to fabricate.

The actual limit on the dimensions of window varies with its shape. As the skilled practitioner will understand, for example, a circle with a radius of 90 nm×S transmits more light than does a square with edges of 90 nm×S. As a general guideline, however, it is advisable when patterning with light having a wavelength greater than or equal to about 248 nm, either the largest dimension of the window should be 130 nm×S or less, or the smallest dimension should preferably be no more than about 70 nm or less. When patterning with light having a wavelength greater than or equal to about 193 nm, either the largest dimension of the window should be 100 nm×S or less, or the smallest dimension should be no more than 50 nm×S or less.

For some irregular shapes, or shapes that are very large in one dimension, it may be most advantageous to use multiple nonprinting windows, rather than single nonprinting window. It is envisioned that all interior nonprinting windows for a single masked feature will most advantageously have the same phase; i.e. either all will or all will not be alternating phase shifters.

This description has referred to blocking material surrounding the nonprinting interior window. In the present invention, blocking material substantially entirely surrounds the window in the plane of the photomask. A blocking material is one that transmits 15 percent or less of incident light. The most commonly used blocking material is chromium, which is opaque. Other materials are used as well, however. One blocking material that is advantageously used with the photomask of the present invention is molybdenum silicide. Molybdenum silicide transmits from about 6 to about 15 percent of incident light, and also reverses its phase. When a masked feature includes a nonprinting interior window which comprises an alternating phase shifter, the window substantially entirely surrounded in the plane of the photomask by blocking material, it may be advantageous to use molybdenum silicide as the blocking material.

Other materials have similar properties, and can also be used in place of molybdenum silicide. Possible blocking materials include tantalum silicon oxide, among others.

Figure 12:
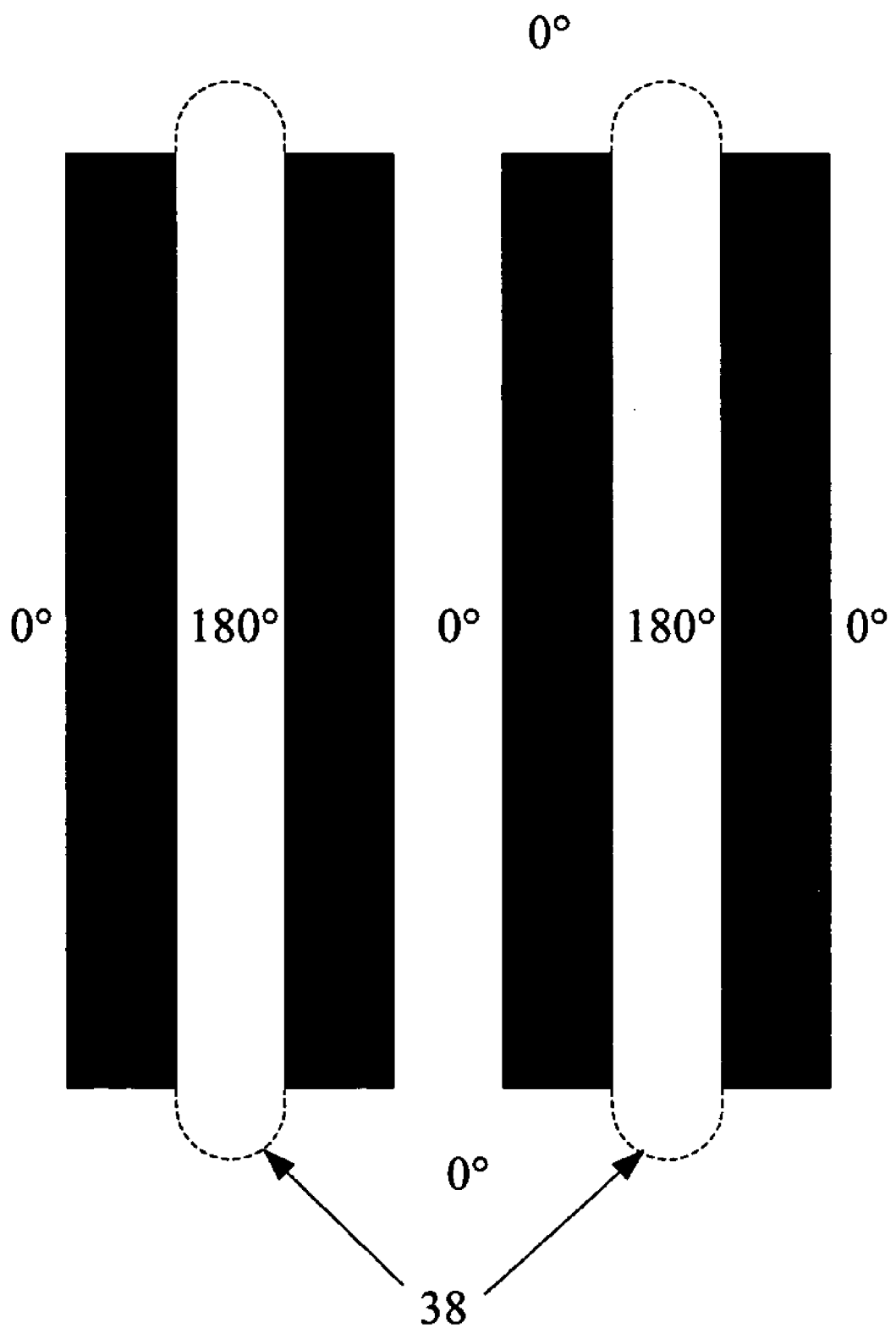
FIG. 12 illustrates the need for a trim mask in conventional alternating phase shifting photomasks.

The present invention provides an additional important advantage, in that no secondary trim mask is required, as is usual when alternating phase shifters are used. FIG. 12 shows a conventional layout, including phase assignments, to create a line-and-space pattern. The phase assignments for the spaces between lines alternate between zero and 180 degrees, as shown, avoiding phase conflict.

The difficulty arises in regions 38, at the ends of the between-line spaces that have a phase of 180 degrees. Typically the area outside of the line-and-space pattern is zero degrees. Where the 180 degree phase space and the zero degree surround meet, an unwanted residual photoresist feature will be formed, as described earlier. Conventionally, such residual features are removed using a subsequent trim mask. Use of an additional mask entails extra time and processing cost.

It has been shown that by placing opposite phases strictly within and outside features, unintentional creation of such unwanted residual photoresist features can be avoided. The line-and-space pattern of FIG. 12 can be arranged as in FIG. 10 instead, with one phase interior to the lines, and the opposite phase both between the lines and in the surrounding area outside of the line-and-space pattern, creating no residuals.

Monolithic three dimensional memory arrays are described in Johnson et al., U.S. Pat. No. 6,034,882, "Vertically stacked field programmable nonvolatile memory and method of fabrication"; Johnson, U.S. Pat. No. 6,525,953, "Vertically stacked field programmable nonvolatile memory and method of fabrication"; Knall et al., U.S. Pat. No. 6,420,215, "Three Dimensional Memory Array and Method of Fabrication"; Lee et al., U.S. patent application Ser. No. 09/927648, "Dense Arrays and Charge Storage Devices, and Methods for Making Same," filed Aug. 13, 2001; Herner, U.S. application Ser. No. 10/095962, "Silicide-Silicon Oxide-Semiconductor Antifuse Device and Method of Making," filed Mar. 13, 2002; Vyvoda et al., U.S. patent application Ser. No. 10/185507, "Electrically Isolated Pillars in Active Devices," filed Jun. 27, 2002; Walker et al., U.S. application Ser. No. 10/335089, "Method for Fabricating Programmable Memory Array Structures Incorporating Series-Connected Transistor Strings," filed Dec. 31, 2002; Scheuerlein et al., U.S. application Ser. No. 10/335078, "Programmable Memory Array Structure Incorporating Series-Connected Transistor Strings and Methods for Fabrication and Operation of Same," filed Dec. 31, 2002; Vyvoda, U.S. patent application Ser. No. 10/440882, "Rail Schottky Device and Method of Making", filed May 19, 2003; and Cleeves et al., "Optimization of Critical Dimensions and Pitch of Patterned Features in and Above a Substrate," U.S. patent application Ser. No.10/728451, filed on even date herewith, all assigned to the assignee of the present invention and hereby incorporated by reference.

A monolithic three dimensional memory array is one in which multiple memory levels are formed above a single substrate, such as a wafer, with no intervening substrates. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

These monolithic three dimensional memory arrays are highly dense structures. Thus photomasks made according to the present invention can advantageously be used to pattern any of the lines, pillars, or other tightly-packed structures formed at any level of these arrays.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method of forming a plurality of substantially evenly spaced pillars, the method comprising:
   forming a layer of a first material;
   depositing photoresist on the first material;
   patterning the photoresist using light having a wavelength of about 248 nm or more;
   etching the first material to form the plurality of substantially evenly spaced pillars, the pillars having a pitch of about 220 nm.

2. The method of claim 1 wherein the first material is a semiconductor.

3. The method of claim 2 wherein the semiconductor is silicon.

4. The method of claim 3 wherein the silicon is polycrystalline.

5. The method of claim 1 wherein the pillars are portions of memory cells, and wherein the step of patterning the photoresist includes patterning photoresist pillars.

6. The method of claim 5 wherein the memory cells are a portion of a first memory level at a first height above a substrate.

7. The method of claim 6 wherein the first memory level is in a monolithic three dimensional memory array comprising at least a second memory level formed at a second height above the substrate, the second height different from the first height.

* * * * *